United States Patent [19]

Mizunuma

[11] Patent Number: 5,389,574
[45] Date of Patent: Feb. 14, 1995

[54] SELECTIVE ETCHING METHOD FOR III-V GROUP SEMICONDUCTOR MATERIAL USING A MIXED ETCHING GAS AND A STOP-ETCHING GAS

[75] Inventor: Yasuyuki Mizunuma, Kanagawa, Japan

[73] Assignee: Sony Corporation, Tokyo, Japan

[21] Appl. No.: 136,597

[22] Filed: Oct. 14, 1993

Related U.S. Application Data

[63] Continuation of Ser. No. 946,607, Sep. 18, 1992, abandoned.

[30] Foreign Application Priority Data

Sep. 20, 1991 [JP] Japan .................................. 3-268536

[51] Int. Cl.$^6$ ...................... H01L 21/44; H01L 21/48
[52] U.S. Cl. .......................................... 437/184; 437/5; 437/96; 437/912; 156/646
[58] Field of Search ..................... 437/184, 905, 22–23, 437/5, 912, 96; 156/646

[56] References Cited

U.S. PATENT DOCUMENTS

| | | | |
|---|---|---|---|
| 4,734,152 | 3/1988 | Geis et al. | 156/646 |
| 4,742,026 | 5/1988 | Vatus et al. | 437/245 |
| 4,830,705 | 5/1989 | Loewenstein et al. | 156/643 |
| 4,889,831 | 12/1989 | Ishii et al. | 437/184 |
| 5,073,508 | 12/1991 | Villalon | 437/31 |

OTHER PUBLICATIONS

Dry Etching for Fabrication of Integrated Circuits in III-V Compound Semiconductors Cooper III et al, Semicon/West, San Mateo, Calif., May 1987.

*Primary Examiner*—George Fourson
*Assistant Examiner*—H. Jey Tsai
*Attorney, Agent, or Firm*—Hill, Steadman & Simpson

[57] ABSTRACT

A selective etching method by etching a III-IV group compound semiconductor which is substantially free from Al and which is disposed adjacent to a III-IV group compound semiconductor containing Al, using a mixed gas at least containing a gas containing C and F as constituent gases and a gas containing Si and Cl as constituent gases.

2 Claims, 4 Drawing Sheets

SELECTIVE ETCHING METHOD FOR III-V GROUP SEMICONDUCTOR MATERIAL USING A MIXED ETCHING GAS AND A STOP-ETCHING GAS

This is a continuation of application Ser. No. 07/946,607, filed Sep. 18, 1992, abandoned.

BACKGROUND OF THE INVENTION

1. Field of the Invention

This invention relates to a selective ion etching method and, more particularly, to a method for selectively etching, with a high etching selectivity and without employing a Freon-based gas, a layer of a III-V group compound semiconductor essentially free from Al, such as GaAs compound semiconductor, which has been formed on an Al-containing III-V group compound semiconductor, such as AlGaAs compound semiconductor. More particularly, it relates to a method for producing a field effect transistor, such as high electron mobility transistor (HEMT) or MES-FET, by taking advantage of the selective etching with a high selectivity ratio.

2. Prior Art

Compound semiconductors, such as GaAs, are finding a widespread use in recent days because of the higher electron mobility proper to the compound semiconductor than that achieved with silicon prevalently used as a semiconductor. The high-speed field effect transistor (FET) making use of the compound semiconductor has now become the fundamental, technique in the field of high speed communication and electronic computers.

Meanwhile, when preparing a HEMT or MES-FET using a GaAs substrate, formation of a gate electrode is a step which is most critical throughout the entire production process. That is, the characteristics of the device depend on the shape or the size of the gate electrode. Above all, if the gate length is reduced to a minute size in search for an elevated operating speed, it becomes most critical to produce the gate electrode with high reproductivity.

As a technique of forming a gate electrode in a field effect transistor making use of the GaAs substrate, there has so far been known a technique of employing a dummy gate as described in Japanses Patent Publication laid-open No.62-60269. There is also known a technique of performing a recess etching after which the gate electrode is formed. If the gate electrode is formed after the recess etching, there results a lowered RS value.

In conventional recess etching, wet etching using a phosphate-based material or a dry etching using a $CCl_2F_2$/He type gas has been employed. In carrying out such recess etching by the conventional HEMT dry etching, an n-AlGaAs layer, as an electron donor layer, is formed on an undoped GaAs layer, an interface of which functions as a two-dimensional electron channel layer. A GaAs layer, as a cap layer, is then formed on the n-AlGaAs layer. The GaAs layer is then removed by recess etching with a high selectivity ratio and the gate electrode is subsequently formed.

However, if wet etching or dry etching using a $CCl_2F_2$/He gas is used by way of the above-mentioned recess etching, the following problems ar raised.

That is, if a recess is to be formed by wet etching, the recess can be formed only with poor uniformity or reproductivity, such that it is difficult to produce elements with constant characteristics.

On the other hand, if the recess is to be formed by dry etching using the $CCl_2F_2$ gas, since the $CCl_2F_2$ gas itself is among gases placed under the regulation of the Freon gases, use of a large quantity of the gas leads to destruction of the environment of the earth. $SiCl_4/SF_6$ base gases or $Cl_2/SF_6$ gases, proposed as alternative gas for the $CCl_2F_2$/He gas, are inconvenient in that the gases may be deposited on high pressure regions.

OBJECT AND SUMMARY OF THE INVENTION

In view of the above-depicted problems of the prior art, it is an object of the present invention to provide a method for producing a field effect transistor in which a gate electrode may be formed by etching a layer of the GaAs/AlGaAs based compound semiconductor with good reproductivity and with which it is possible to prevent environmental destruction otherwise caused by Freon gases.

For accomplishing the above object, the present invention provides a method for producing a field effect transistor comprising the steps of depositing an AlGaAs based layer and a GaAs layer on a channel layer, selectively etching the GaAs layer on the AlGaAs based layer using a mixed gas comprising a gas containing carbon and fluorine as constituent gases, a gas containing silicon and chlorine as constituent gases and a rare gas, and forming a gate electrode in a substrate region from which the GaAs layer has been selectively etched.

It is noted that the field effect transistors to which the present invention is applied may be enumerated by, for example, high electron mobility transistor (HEMT) and MES-FET. However, the present invention may be applied to any other types of the field effect transistors having a structure in which the deposited AlGaAs based and GaAs layers are removed by etching to form the gate electrode at the etched region.

Meanwhile, in consideration that etching is discontinued by a mechanism which will be explained subsequently, the AlGaAs based layer may also be a layer of a material additionally containing some other element(s), such as an AlInGaAs layer.

The gas containing carbon and fluorine as constituent elements may be a fluorocarbon based gas, such as $CF_4$, $CHF_3$, $C_2F_6$, $C_3F_8$, $CH_2F_2$ or $CBrF_3$. The gas containing silicon and chlorine as constituent gases may be a silane-based gas, such as $SiCl_4$, $SiH_2Cl_2$ and $SiHCl_3$. The rare gas may be He, Ne, At, Kr, Xe or Rn.

The above-mentioned mixed gas employed in the present invention is capable of producing the same etching species as those produced by using a Freon based gas by electric discharge, so that it is capable of causing etching of the GaAs layer to proceed by a similar mechanism. However, if etching of the GaAs layer proceeds to expose the underlying AlGaAs layer, $AlF_3$ which is low in vapor pressure and stable is produced, so that the surface of the AlGaAs layer is inactivated and hence etching ceases to proceed. A high selectivity ratio may be achieved by this mechanism to permit formation of the gate electrode to proceed in stability.

Since the constituent gases of the mixed gas are not those gases containing both chlorine atoms and fluorine atoms in the individual molecules, they do not lead to environmental destruction even if they are discharged out of the etching reaction system without discharge dissociation. Thus the present invention is highly effective as post-Freon measures.

DESCRIPTION OF THE PREFERRED EMBODIMENTS

Certain preferred embodiments of the present invention will be explained hereinbelow.

Experimental Examples of Selective Etching

Before proceeding to explanation of the preferred embodiments of the present invention, an experiment conducted by the present inventor in connection with the GaAs/AlGaAs selectivity ratio is explained. It is shown by this experiment that a mixed gas according to the present invention is highly effective in recess etching prior to gate formation in the field effect transistor (FET).

In the present experiment, the gas pressure dependency of the selectivity between the n-type GaAs layer and the n-type AlGaAs layer under a constant high frequency power density and the composition of a certain mixed gas was scrutinized. The mixed gas consisted essentially of a $CF_4$ gas, a $SiCl_4$ gas and a He gas. The high frequency power was fixed at 0.05 W/cm$^2$ (25 W) and the composition of the mixed gas was set to $CF_4$:$SiCl_4$:He=19.7:3.45:29 in terms of flow ratios. Etching was conducted for five minutes while the gas pressure was variably set to 30 mTorr, 45 mTorr, 60 mTorr and 80 mTorr.

Figure 1:
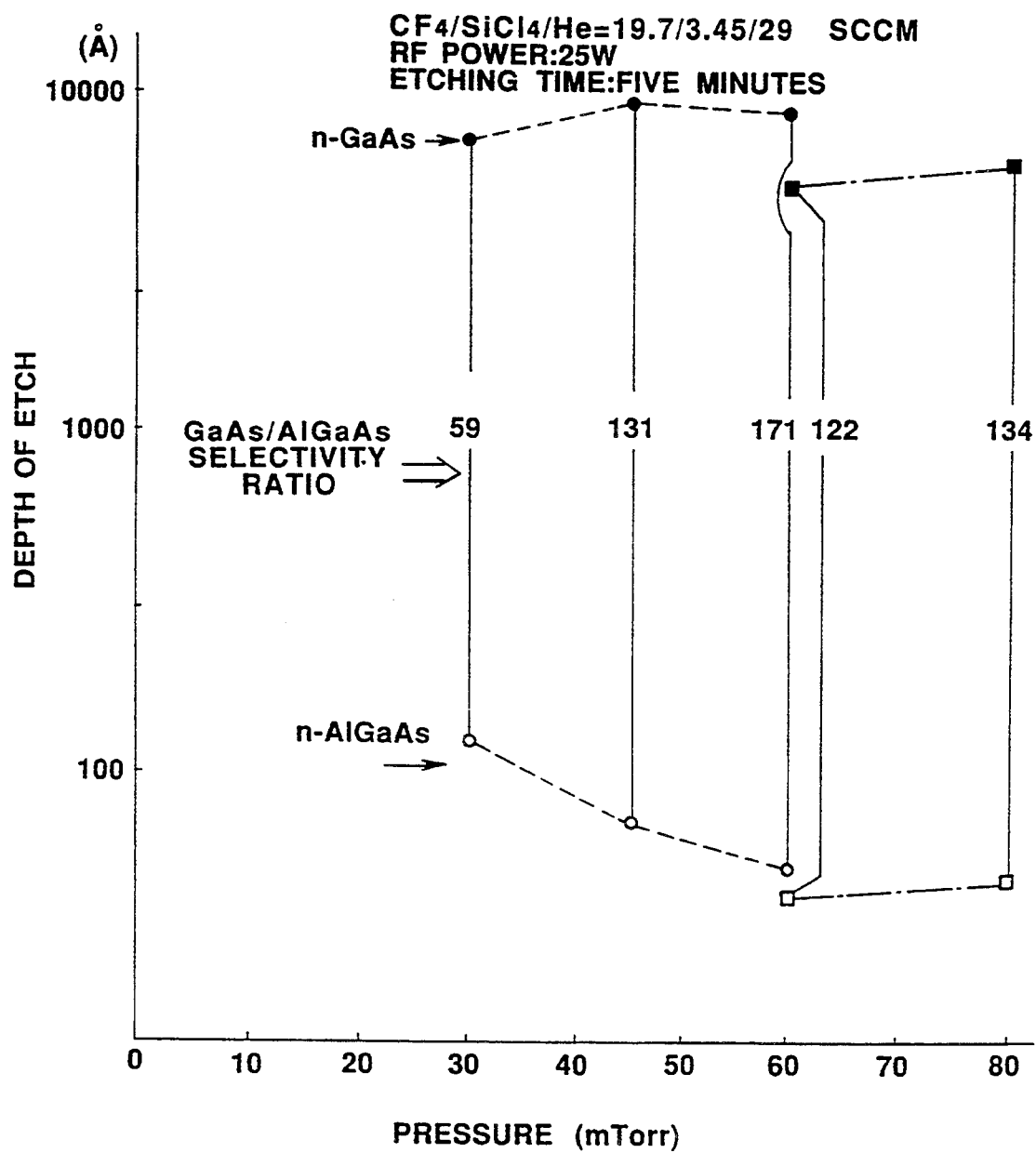
FIG. 1 is a graph showing the GaAs/AlGaAs selectivity ratio by the relation between the gas pressure and the etching depth, and showing the results of an experiment conducted on an illustrative mixed gas employed in the method for producing a field effect transistor of the present invention.

The results of the experiment are shown in FIG. 1, in which the ordinate indicates a depth of etch in a logarithmic scale and the abscissa a gas pressure in mTorr. In this figure, plots of circles in black color and squares in black color indicate the depth of etch of the nGaAs/i-GaAs layer and plots of circles in white and squares in white indicate the depth of etch of the n-type AlGaAs layer. Meanwhile, data indicated in the squares are data added to those indicated in the circles.

The selectivity ratio of the n-type GaAs substrate to the n-type AlGaAs substrate, as calculated from the results of the experiment, is equal to 59 and 131 for the gas pressures of 30 mTorr and 60 mTorr, respectively, while being equal to 171 and 122 for the gas pressure of 60 mTorr and equal to 14 for the gas pressure of 80 mTorr. That is, the results of the experiment indicate that high selectivity etching of GaAs/AlGaAs may be achieved with a low power and less damage with the use of the mixed gas system of the present invention.

First Embodiment

The present embodiment is directed to a typical method for producing a HEMT in which a mixed gas including a $CF_4$ gas, an $SiCl_4$ gas and an He gas is used in the recess etching. The present embodiment is hereinafter explained by referring to FIGS. 2 to 4.

Figure 2:
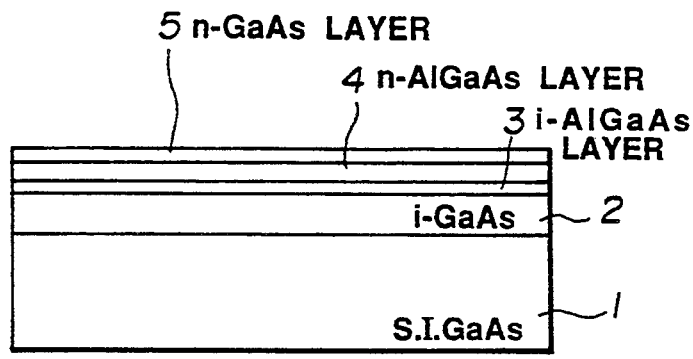
FIG. 2 is a cross-sectional view showing the process for producing the field effect transistor according to a first embodiment of the present invention, up to a step of forming an n-GaAs layer.

Referring first to FIG. 2, an i-(undoped)-GaAs layer 2, on a heterojunction of which a two-dimensional electron channel layer (2DEG) is formed, is formed by an epitaxial growth technique on a semi-insulating GaAs substrate 1. An i-AlGaAs layer 3 as a spacer layer and an n-AlGaAs layer 4, functioning as a spacer layer, are similarly deposited on the i-GaAs layer 2 by the epitaxial growth technique. The AlGaAs layer 4 is doped with Si in order to provide the n-conductivity type. An n-GaAs layer 5 as a cap layer is deposited on the n-AlGaAs layer 4.

A dielectric layer 6, which is a silicon oxide film or a silicon nitride film, for example, is deposited on the n-GaAs layer 5. After the formation of the dielectric layer 6, a resist layer 7 is applied on the entire surface of the dielectric film 6, and the resist layer 7 is patterned by selective light exposure and development for forming an opening in which a gate is to be formed subsequently. The resist layer 7 may be formed of, for example, an electron ray reactive type PMMA based material. Using the resist layer 7 as a mask, a window is formed in the dielectric layer 6 by reactive ion etching (RIE). At this stage, the surface of the n-GaAs layer 5 is exposed on the bottom of the opening in the dielectric layer 6.

Figure 3:
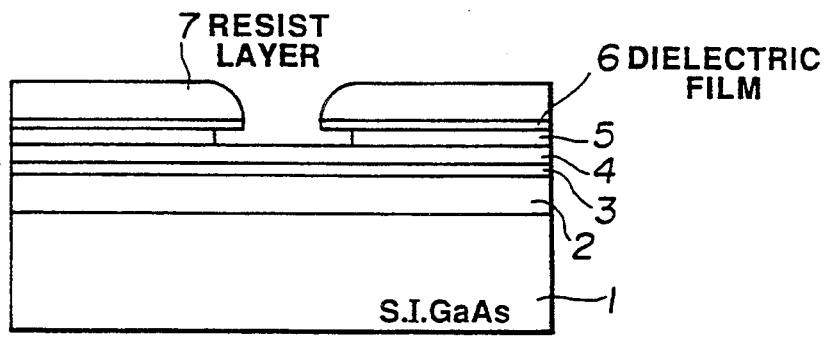
FIG. 3 is a cross-sectional view showing the process for producing the field effect transistor according to the first embodiment of the present invention, up to a step of forming a resist layer.

With the present embodiment, the n-GaAs layer 5 is then gate recess etched, using a mixed gas of the $CF_4$ gas, $SiCl_4$ gas and the He gas. Since the etching is carried out with a high selectivity ratio equal to 100 or more, as shown by the above-described experiment, the etching is terminated substantially at an interface between the n-GaAs layer 5 and the n-AlGaAs layer 4, as shown in FIG. 3. Since undercutting is incurred as a result of the recess etching, a transistor of a shape superior in gate leakage or gate withstand voltage may be produced.

As an example of the recess etching, the flow rate of the mixed gas may be set to $CF_4$/$SiCl_4$/He=19.7/3.45/29, as in the above experiment. Besides, the flow rate as well as the gases may be modified, if so desired.

Figure 4:
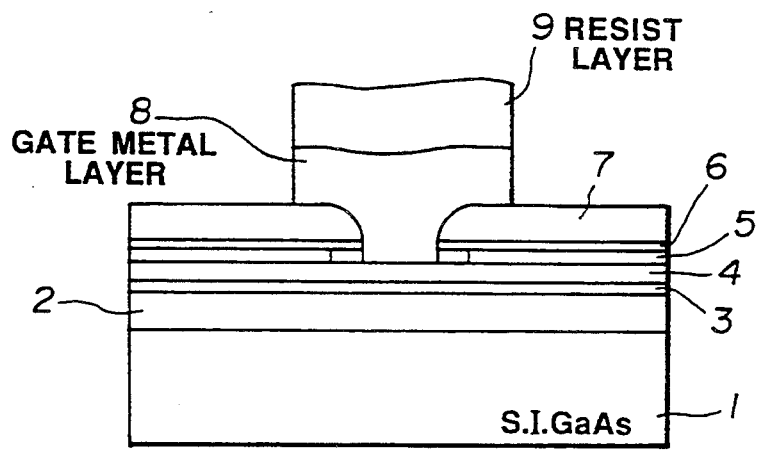
FIG. 4 is a cross-sectional view showing the process for producing the field effect transistor according to the first embodiment of the present invention, up to a step of processing a gate metal.

After the above-mentioned recess etching, a gate metal layer 8 is deposited by evaporation on the entire surface of the substrate. The gate metal layer 8 is deposited in a recess formed by the recess etching so that the gate metal layer 8 is Schottky-contacted with the surface of the n-AlGaAs layer 4 with an extremely fine line width. A resist layer 9 is then applied to the entire surface and patterned to a metallization pattern of the gate electrodes. The gate metal layer 8 is then cut, using the patterned resist layer 9 as a mask, for forming a tee-shaped gate electrode, as shown in FIG. 4. The HEMT is subsequently completed in accordance with a customary process.

With the method for producing the field effect transistor according to the present embodiment, since the recess etching for forming the gate electrode is carried out by dry etching of high selectivity, the gate electrode may be formed with high uniformity and reproducibility without fluctuations in the production process. Besides, the present method is effective for environmental protection as post-Freon measured.

As to typical characteristics of the HEMT produced in accordance with the method of the present embodiment, the gate element is of a gate length of 0.28 $\mu$m and a gate width of 200 $\mu$m and the maximum value of mutual conductance gm of 345 ms/nm has been realized with the drain current Vds of 2 V.

Second Embodiment

The present embodiment, directed to a method for producing an MES-FET, is hereinafter explained by referring to FIGS. 5 and 6.

An n-GaAs layer 12, which is to be an active layer, is first formed on a semi-insulating GaAs substrate 11. An AlGaAs layer 13, functioning as a etching stop, is formed on the n-GaAs layer 12. The AlGaAs film 13 has an extremely small film thickness of the order of tens of Angstroms. The AlGaAs film 13 may be formed only in the region in which the gate is to be formed. An n-GaAs layer 14 is formed on the AlGaAs film 13.

A mask layer 15 for opening the region in which to form the gate is coated on the n-GaAs layer 14. The mask layer 15 is processed so as to have an opening 16 in register with the region in which the gate is to be formed.

Figure 5:
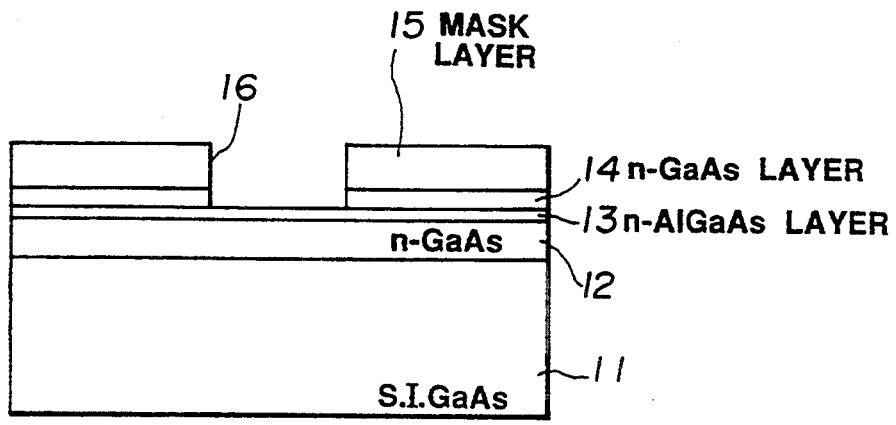
FIG. 5 is a cross-sectional view showing the process for producing the field effect transistor according to a second embodiment of the present invention, up to a step of forming an opening in the resist layer.
Figure 6:
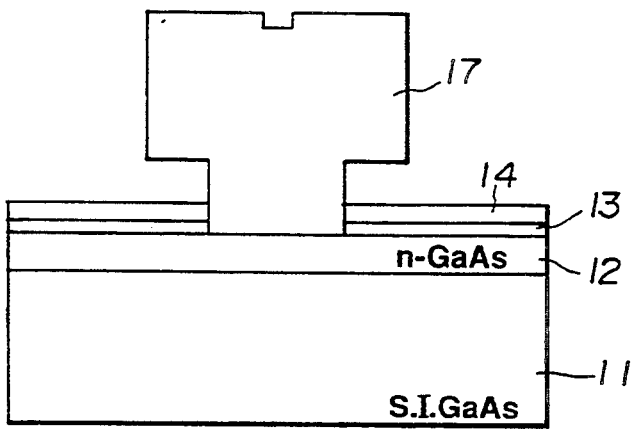
FIG. 6 is a cross-sectional view showing the process for producing the field effect transistor according to the second embodiment of the present invention, up to a step of processing a gate metal.

Then, as shown in FIG. 5, dry etching is carried out by a mixed gas, using the mask layer 15 having the opening 16 as a mask. The mixed gas may be composed of, for example, a $CF_4$ gas, $SiCl_3$ gas and an He gas, as in the first embodiment. Due to the high selectivity ratio between GaAs and AlGaAs, the n-GaAs layer 14 is etched off gradually until etching is positively terminated at the surface of the AlGaAs film 13.

A gate metal layer 17 then is vacuum deposited and subsequently patterned while the mask layer 15 is removed. The AlGaAs film 13 of the extremely thin thickness is also removed, when necessary. As a result thereof, a MES-FET having a tee-shaped gate structure, as shown in FIG. 6, is completed.

Third Embodiment

Figure 7:
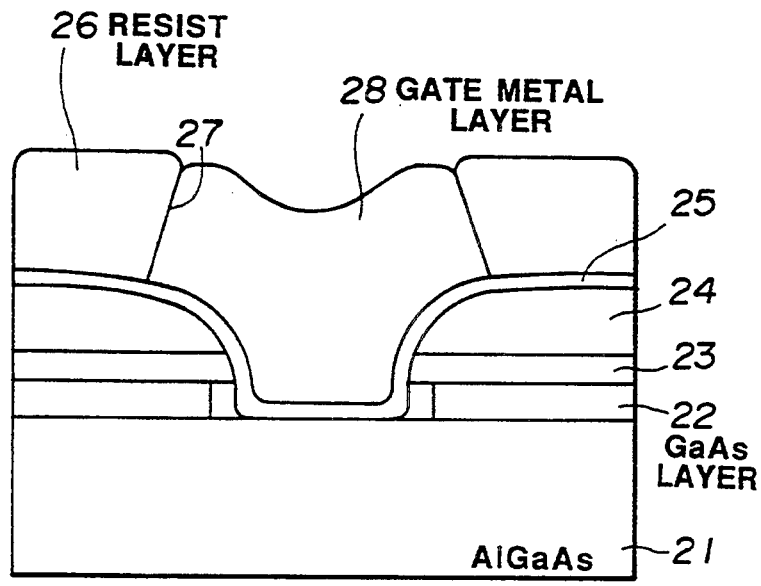
FIG. 7 is a cross-sectional view showing the process for producing the field effect transistor according to a third embodiment of the present invention, up to a step of processing a gate metal.
Figure 8:
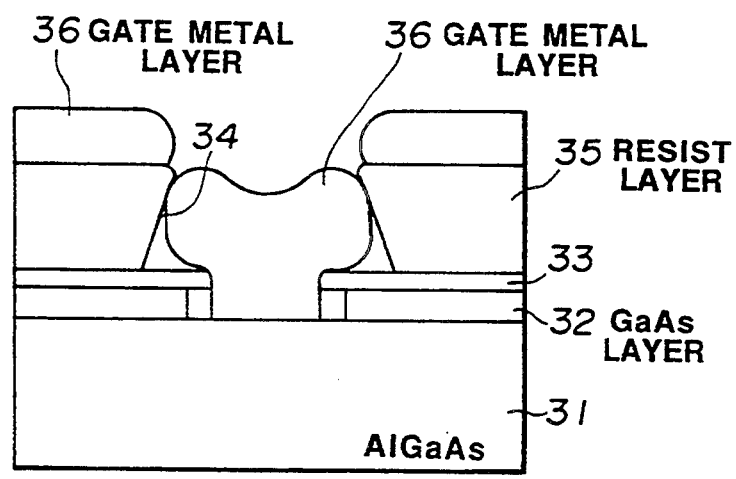
FIG. 8 is a cross-sectional view showing the process for producing the field effect transistor according to a fourth embodiment of the present invention, up to a step of processing a gate metal.

The present embodiment is directed to a method for producing a gate structure of an HEMT shown in FIG. 7.

That is, using a mixed gas composed of a C- and F-containing gas, an Si- and Cl-containing gas and a rare gas, and a desired RF power, a desired pressure and a desired gas flow rate, a GaAs layer 22 on an AlGaAs layer 21 is selectively removed. At this time, a dielectric film 23, consisting of a silicon oxide film or a silicon nitride film, and a resist layer 24, are used as a mask. Meanwhile, the process is the same as the process shown in FIG. 3 up to this step.

During this etching process, etching with high selectivity and uniformity is carried out by taking advantage of the high selectivity proper to the above-mentioned mixed gas. A lower region of the dielectric film 23 is undercut for improving gate characteristics.

A plating underlying layer 25, consisting of a thin metal film, is deposited, such as by vacuum deposition, on the entire surface as shown. After deposition of the plating underlying layer 25, a resist layer 26 is formed and an opening 27 is formed in the portion of the resist layer 26 in which the gate is to be formed. Using the resist layer 26 having the opening 27 as a mask, a gate metal layer 28 shown in FIG. 7 is deposited and any excess portions of the gate metal layer 28, plating underlaying layer 25 and the resist layer 26 are removed to complete the device.

Meanwhile, the dielectric film 23 or the resist layer 24 may be removed during the above process.

Fourth Embodiment

The present embodiment is an application to a lift-off method.

Using a mask film 33 having as a window a region in which a gate is to be formed, as a mask, and using a mixed gas of a C-and F-containing gas, an Si- and Cl-containing gas and a rare gas, a GaAs layer 32 on the AlGaAs layer 1 is selectively removed with a desired RF power, a desired pressure and a desired gas flow rate.

During this etching process, etching with high selectivity and uniformity is carried out by taking advantage of the high selectivity proper to the above-mentioned mixed gas. A lower region of the mask film 33 is undercut for improving gate characteristics.

A resist layer 35, having an opening 34 in a region thereof in which a gate is to be formed, is formed. The opening 34 may have a size in the direction of the gate length which is larger than the size of the window opening in the mask film 3. The resist film 35 is of a thickness such that a step difference is produced in a metal film at the site of a step of the resist layer 35.

After the formation of the resist layer 35, having such opening 34, the gate metal layer 36 is formed on the entire surface. The gate metal layer 36 is stepped on its upper surface due to the step difference in the opening 34 so that patterned gate metal is left within the opening 34. Any excess gate metal portions except the gate metal on the resist layer 35 and the gate electrode are removed for completing the device.

It is to be noted that the method for producing the field effect transistor according to the present invention may be applied to gate structures other than those described in the above-described embodiments.

What is claimed is:

1. A selective etching method comprising etching a III-V group compound semiconductor free from Al, said III-V group compound semiconductor free from Al being adjacent to a III-V group compound semiconductor containing Al, using a mixed gas containing a fluoride stop-etching gas containing C and F as constituent elements and a chloride etching gas consisting of Si and Cl as constituent elements, wherein the III-V group compound semiconductor containing Al is a compound semiconductor composed at least of Al, Ga and As and wherein said III-V group compound semiconductor which are free from Al are compound semiconductors at least composed of Ga and As and are free from Al, wherein the stop-etching gas consisting of C and F as constituent elements is at least one fluorocarbon based gas selected from the group consisting of $CF_4$, $C_2F_6$, $C_3F_8$, $CHF_3$, $CH_2F_2$ and $CBrF_3$ and wherein the etching gas consisting of Si and Cl as constituent gases is at least one silane-based gas selected from the group consisting of $SiCl_4$, $SiH_2Cl_2$ and $SiHCl_3$, and wherein a rare gas is additionally contained in the mixed gas and is one or more gases selected from the group consisting of He, Ne, Ar, Kr, Xe and Rn.

2. A method for producing a field effect transistor comprising a step of forming a channel region on a substrate, a step of forming a layer of a first compound semiconductor comprising at least Al, Ga and As, a step of forming a layer of a second compound semiconductor comprising at least Ga and As and free from Al, and a step of selectively etching the layer of the second compound semiconductor on other layer of the first compound semiconductor using a mixed gas consisting of a stop-etching fluorocarbon based gas and an etching silane based gas, characterized by further comprising a step of forming a gate electrode on a region on the substrate from which the layer of the second compound semiconductor has been selectively etched to expose the layer of the first compound semiconductor, in which said stop-etching fluorocarbon gas and said etching silane based gas of the mixed gas employed in the selective etching are at least one selected from the group consisting of $CE_4$, $C_2F_6$, $C_3F_8$, $CHF_3$, $CH_2F_2$ and $CbrF_3$ and at least one selected from the group consisting of $SiCl_4$, $SiH_2Cl_2$ and $SiHCl_3$, and wherein a rare gas is additionally contained in the mixed gas employed in the step of selective etching and is one or more gases selected from the group consisting of He, Ne, Ar, Kr, Xe and Rn.

* * * * *